United States Patent [19]
Duerr

[11] Patent Number: 5,107,217
[45] Date of Patent: Apr. 21, 1992

[54] RADIO FREQUENCY ANTENNA FOR A NUCLEAR MAGNETIC RESONANCE TOMOGRAPHY APPARATUS

[75] Inventor: Wilhelm Duerr, Erlangen, Fed. Rep. of Germany

[73] Assignee: Siemens Aktiengesellschaft, Munich, Fed. Rep. of Germany

[21] Appl. No.: 499,771

[22] Filed: Mar. 27, 1990

[30] Foreign Application Priority Data

Mar. 29, 1989 [DE] Fed. Rep. of Germany ....... 3910187

[51] Int. Cl.$^5$ ........................................... G01R 33/20
[52] U.S. Cl. ................................... 324/322; 333/219
[58] Field of Search ............... 324/300, 307, 309, 314, 324/318, 322; 333/219

[56] References Cited

U.S. PATENT DOCUMENTS

| | | |
|---|---|---|
| 4,435,680 | 3/1984 | Froncisz et al. |
| 4,446,429 | 5/1984 | Froncisz et al. |
| 4,506,224 | 3/1985 | Krause. |
| 4,620,155 | 10/1986 | Edelstein ............................. 324/318 |
| 4,742,304 | 5/1988 | Schnall et al. |
| 4,755,756 | 7/1988 | Nishihara et al. ................... 324/322 |
| 4,792,759 | 12/1988 | Keren et al. ........................ 324/322 |
| 4,801,885 | 1/1989 | Meissner et al. |
| 4,881,034 | 11/1989 | Kaufman et al. ................... 324/318 |

FOREIGN PATENT DOCUMENTS 0094734 11/1983 European Pat. Off.
0257782 3/1988 European Pat. Off.
0301232 2/1989 European Pat. Off.

OTHER PUBLICATIONS

"The Design and Use of Dual-Frequency Surface Coil Providing Proton Images for Improved Localization in 31P Spectroscopy of Small Leisons", Leach et al., Medical Physics, vol. 13, No. 4, Jul./Aug. 1986, pp. 510-513.

Primary Examiner—Michael J. Tokar
Attorney, Agent, or Firm—Hill, Van Santen, Steadman & Simpson

[57] ABSTRACT

A radio frequency antenna for a nuclear magnetic resonance tomography apparatus has interior conductors which form a transmission line resonator with at least one shortening capacitor. The transmission line resonator can resonate at a plurality of resonator frequencies, and a trap circuit is provided for decoupling the interior conductors from the other conductors. The antenna can be operated at a number of different resonate frequencies, for example, at frequency $f_1 = 170$ MHz for protons (hydrogen) and $F_2 = 69$ MHz for phosphorous.

13 Claims, 3 Drawing Sheets

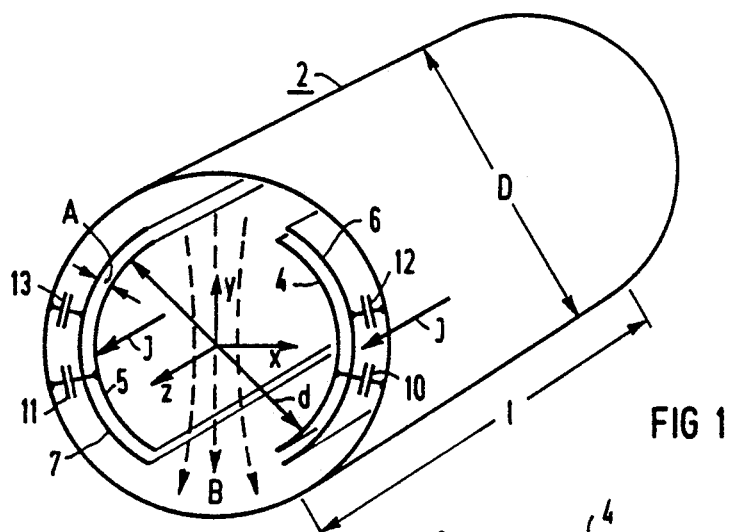
FIG 1
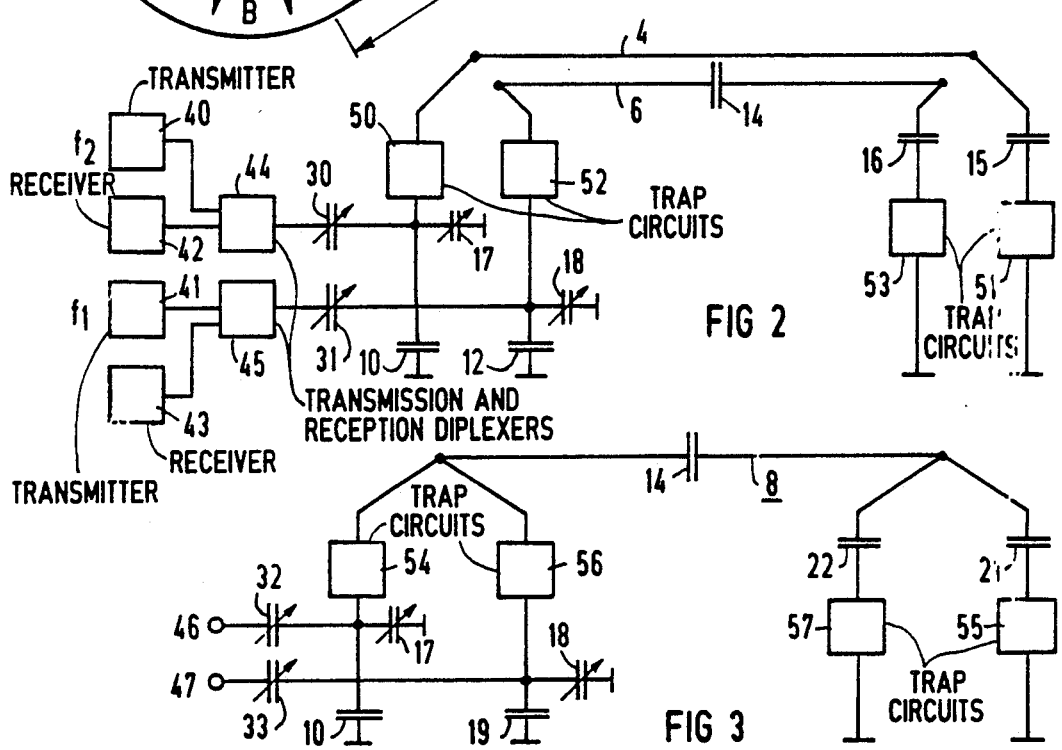
FIG 2
FIG 3
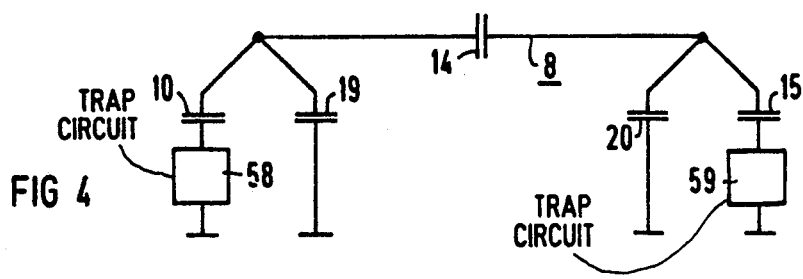
FIG 4

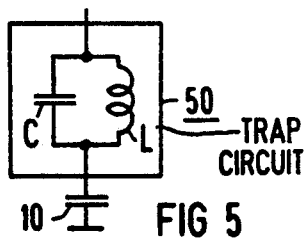
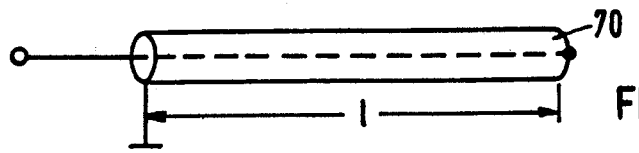
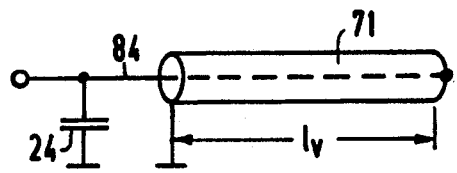
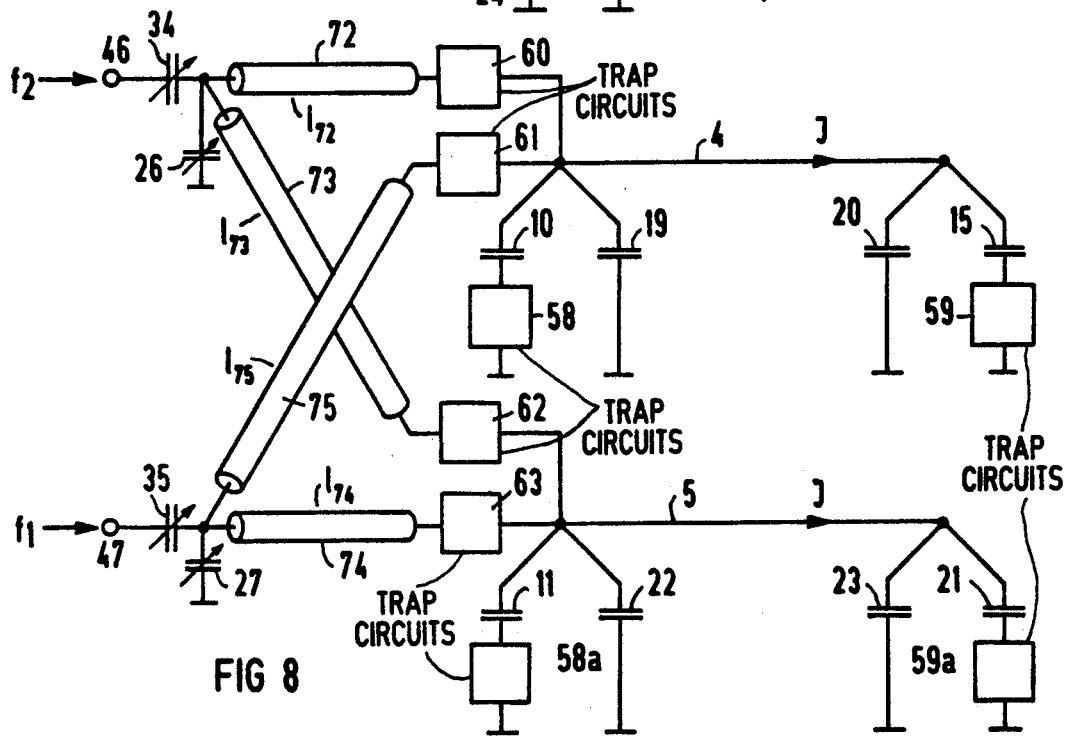
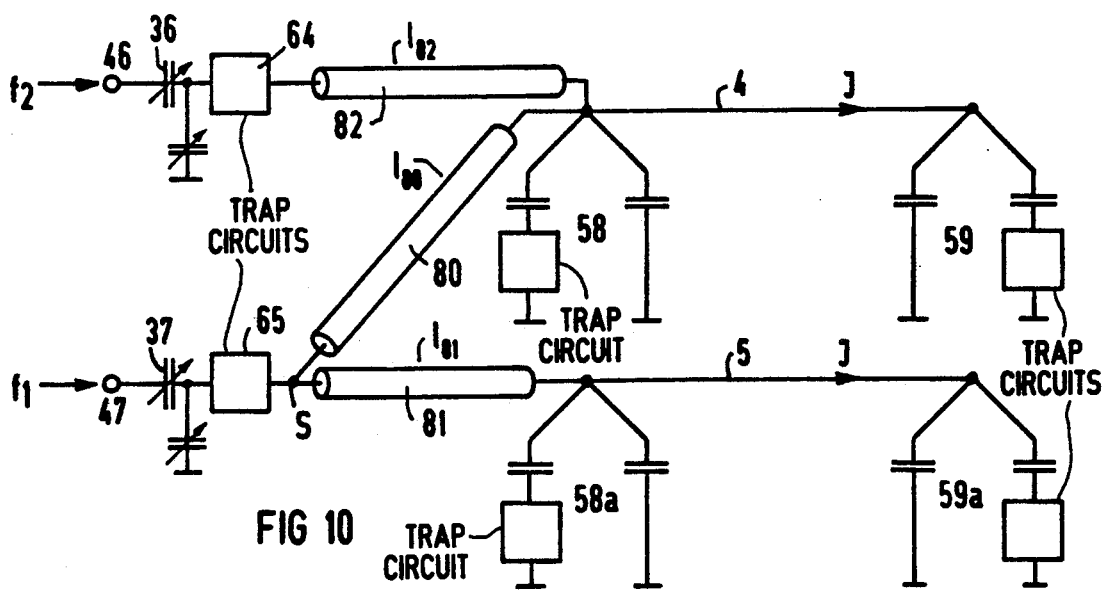

RADIO FREQUENCY ANTENNA FOR A NUCLEAR MAGNETIC RESONANCE TOMOGRAPHY APPARATUS

BACKGROUND OF THE INVENTION

1. Field of the Invention

The present invention is directed to a radio frequency antenna for a nuclear magnetic resonance tomography apparatus, and in particular to such an antenna having a cylindrical sheath which is radio frequency-tight and low frequency-transmissive which surrounds at least two interior conductors extending parallel to a cylinder axis, the inductance of the inside conductors forming a transmission line resonator in combination with at least one shortening capacitor.

2. Description of Prior Art

Nuclear magnetic resonance tomography devices are used in the field of medical diagnostics, wherein an image similar to an x-ray tomogram is constructed from the three-dimensional spin density of atomic nuclei in an examination subject, or from the distribution of relaxation time of such nuclei, by computational or measuring analysis of integral proton resonance signals. An examination subject, such as a human body, is introduced into a strong, uniform magnetic field, known as the fundamental field, which aligns the nuclear spins subject. Gradient coils are provided which generate selected spatially oriented different magnetic fields. A high-frequency antenna excites the nuclear spins and receives the signal emitted by the excited nuclei. This antenna, which is a radio frequency antenna, is usually connected to a transmitter and to a receiver via matching capacitors, as well as through a transmission/reception diplexer.

A radio frequency antenna is described in European application 0 073 375, corresponding to U.S. Pat. No. 4,506,224, which is formed by a cylindrical sheath which is radio frequency-tight and low frequency-transmissive. The sheath consists of material having a good electrical conductivity, and surrounds at least two interior conductors extending parallel to the longitudinal axis of the cylinder. The interior conductors and the sheath are connected to a transmitter and to a receiver. The interior conductors are terminated with shortening capacitors such that the inductance of the interior conductors in combination with the capacitance of the shortening capacitors form a transmission line resonator. The conductor pairs enable wave propagation inside the sheath at high frequency of, for example, 100 MHz, whereby resonant conditions are established, so that fields which oscillate in equiphase arise in the imaging volume, and standing waves are formed on the interior conductors. The shortening capacitors limit the interior conductors to a length which approximately corresponds to the examination subject, ie., to the size of a human body. In addition to constituting a conductive member for the radio frequency field, the sheath simultaneously functions as a radio frequency shielding from external components. The low-frequency gradient fields can propagate substantially unimpeded in the imaging volume, by contrast, due to the low-frequency permeability of the sheath. The sheath has a thickness which is preferably less than 100 $\mu$m. The radio-frequency antenna is dimensioned for one resonant frequency.

The radio frequency antennas are usually provided in magnetic resonance imaging devices for proton imaging. There is, however, an increasing demand that other atoms, for example phosphorous, fluorine or sodium, be investigated in the same system. Because these atomic nuclei have highly different nuclear magnetic resonances, they can only be investigated with a correspondingly broadband radio frequency antenna. Due to the demand for low systems losses, however, a broadband embodiment of a radio frequency antenna can only be produced with an undesirably high outlay. Different radio-frequency antennas have therefore previously been used for investigating respectively different atomic nuclei. Given employment of radio frequency antennas having relatively slight size, for example, surface coils and head coils, these can be interchanged without significant outlay. This is a practical impossibility for whole-body resonators, and consequently these are only utilized for investigating predetermined atoms, for example exclusively for proton experiments.

SUMMARY OF THE INVENTION

It is an object of the present invention to provide a structure for a whole body resonator for a nuclear magnetic resonance tomography apparatus in the form of a capacitively shortened waveguide resonator which can be used for a plurality of different resonant frequencies, and thus for investigating different atoms without substituting a different resonator.

The above object is achieved in accordance with the principles of the present invention in a radio frequency antenna for a nuclear magnetic resonance tomography apparatus which can resonate at a plurality of different frequencies, and which includes at least two interior conductors for a linearly polarized antenna, and at least four interior conductors for a circularly polarized antenna. In one embodiment, the conductor systems having different resonant frequencies are nested. Inductive coupling can be by avoided trap circuits for the undesired frequencies which are connected at at least one end of the interior conductors in series with the shortening capacitors. The effects of capacitive decoupling of the interior conductors can be substantially avoided by further trap circuits at the other end of the interior conductors.

At the input side, the trap circuits can be directly connected to the interior conductors. A decoupling of the two inputs is thereby achieved.

In a further embodiment, the waveguide resonator for a plurality of resonant frequencies with fixed coupling has only a single interior conductor, which may additionally contain a plurality of shortening capacitors.

The trap circuits are parallel resonant circuits for the resonant frequency to be trapped, and can be in the form of line circuits. If the trap circuits are conducted to ground, coaxial line circuits can be used, with their shielding (jacket) being connected to ground.

DESCRIPTION OF THE DRAWINGS

FIG. 1 is a schematic perspective view of a whole-body antenna for a nuclear magnetic resonance tomography apparatus constructed in accordance with the principles of the present invention.

FIG. 2 is a block circuit diagram for a first embodiment of a transmission line resonator for different frequencies constructed in accordance with the principles of the present invention.

FIG. 3 is a schematic block diagram of a second embodiment of a transmission line resonator for different frequencies constructed in accordance with the principles of the present invention.

FIG. 4 is a schematic block diagram of a third embodiment of a transmission line resonator for different frequencies constructed in accordance with the principles of the present invention.

FIGS. 5, 6 and 7 respectively show different embodiments of the trap circuits which can be used in any embodiment of the transmission line resonator constructed in accordance with the principles of the present invention.

FIGS. 8, 9, and 10 respectively show different embodiments for coupling the transmission line resonator constructed in accordance with the principles of the present invention to a transmitter and receiver.

DESCRIPTION OF THE PREFERRED EMBODIMENTS

Figure 9:
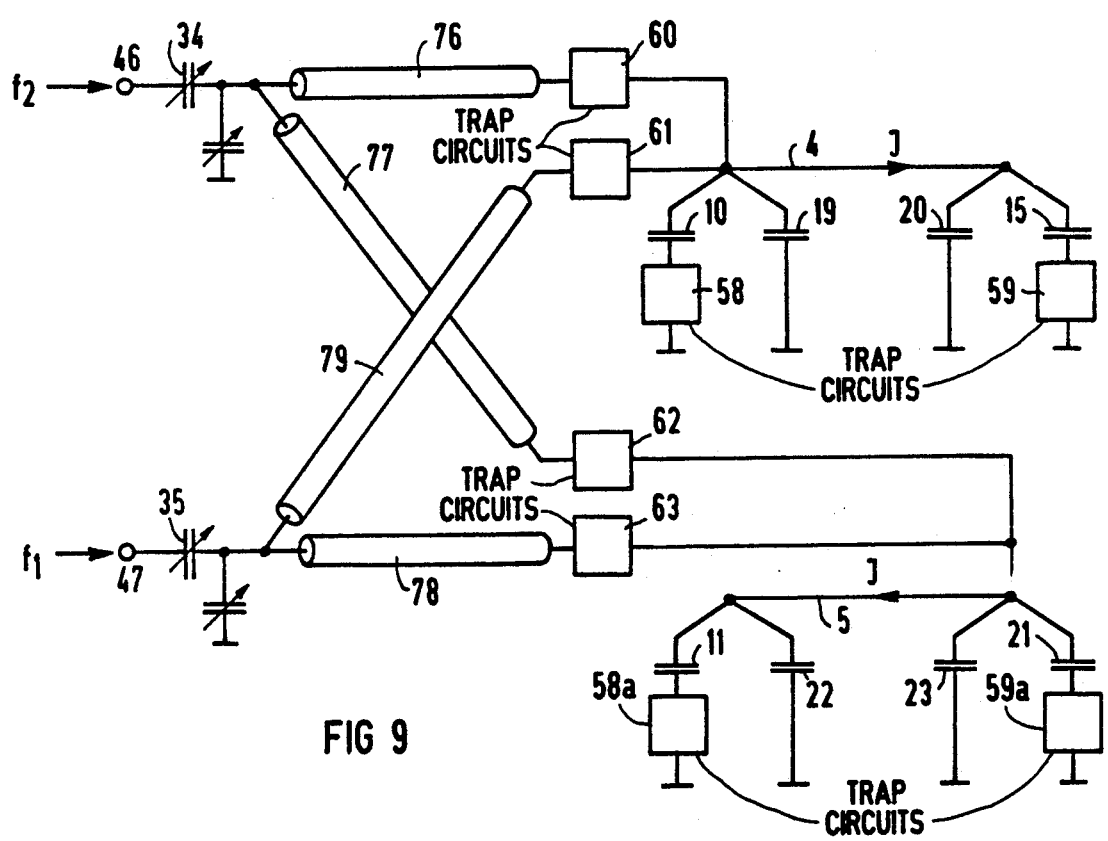

A radio frequency antenna for a nuclear magnetic resonance tomography apparatus constructed in accordance with the principles of the present invention is shown in FIG. 1 and includes a hollow, cylindrical sheath 2. The longitudinal axis of the sheath 2 is oriented in the z-direction of a rectangular x-y-z coordinate system. The sheath 2 has a length λ of, for example, approximately 200 cm and a diameter D of, for example, approximately 70 cm. The sheath may, for example, consist of copper or at least partially silver-plated copper. The sheath 2 may alternatively consist of metallized plastic, for example plastic which is copper-plated or silver-plated, on at least one side. The sheath 2 surrounds four interior conductors 4, 5, 6 and 7, with pairs of these conductors forming a conductor system. In the embodiment of FIG. 1, conductors 4 and 5 form a conductor system and conductors 6 and 7 form another conductor system. The interior conductors 4 through 7 are disposed parallel to the cylinder axis at a distance A from each another of, for example, approximately 2 cm. The conductor system consisting of the interior conductors 6 and 7 is at a distance of about 3 cm from the sheath 2, so that the inner interior conductors 6 and 7 enclose an examination volume having a diameter d of about 60 cm. A radio-frequency magnetic field B indicated by dashed line arrows, which is substantially homogenous in the proximity of the cylinder axis, and which is aligned perpendicularly to the z-axis, is generated with these conductor systems surrounded by the conductor sheath 2. The conductors 4 through 7 are provided with at least one capacitance which determines the effective length of the conductor, and which will be referred to herein as a shortening capacitor. The conductors 4 through 7 are preferably provided with a plurality of such shortening capacitors at at least one end thereof, however, only one such shortening capacitor is shown for each interior conductor in Figure for clarity. These shortening capacitors are referenced 10, 11, 12 and 13 in FIG. 1. In combination with the inductance of the interior conductor connected thereto, the shortening capacitors form a transmission line resonator. The current direction of the interior conductors 4 and 5 and the interior conductors 6 and 7 is indicated by arrows J. The feed for the waveguide resonators and the coupling of the interior conductors 4 through 7 to separate transmitters and receivers are not shown in FIG. 1.

Such coupling of the interior conductors 4 and 6 to a respective transmitters 40 and 41 and to respective receivers 42 and 43 is schematically shown in FIG. 2. The interior conductor 4 for a low resonant frequency, for example $f_2 = 69$ MHz for investigating phosphorous, is provided with at least one shortening capacitor 10 at its beginning. A plurality of shortening capacitors can be provided at the end of the interior conductor 4, however, only one such capacitor reference 15 is shown in FIG. 2 for clarity. The interior conductor 4 also contains a trap circuit 50 for a high resonant frequency, for example $f_1 = 170$ MHz. The trap circuit 50 is provided at the beginning of the interior conductor 4 in series with the terminating capacitor 10, and has an identical trap circuit 51 at its end in series with the shortening capacitor 15. If further shortening capacitors are present, each will have a trap circuit connected in series therewith.

The transmitter 40 is connected at the junction between the trap circuit 50 and the shortening capacitor 10 via a transmission and reception diplexer 44, and via a matching capacitor 30. An additional, variable terminal capacitor 17 for tuning may be connected in parallel with the terminal capacitor 10.

The interior conductor 6 for the high resonant frequency $f_1$ preferably also is connected to an additional shortening capacitor 14. Its beginning of the interior conductor 6 is connected to ground via a trap circuit 52 for the low resonant frequency $f_2$ and the shortening capacitor 12. The end of the interior conductor 6 is also connected to ground, via shortening capacitors only one which is shown in FIG. 2, which is referenced 16, as well as via a trap circuit 53 for the low resonant frequency $f_2$. The connections to ground indicated in FIG. 2 are preferably connections to the sheath 2. The transmitter 41 allocated to the interior conductor 6 is connected to the junction between the trap circuit 52 and the shortening capacitor 12 via a transmission and reception diplexer 45, as well as via a matching capacitor 31. A shortening capacitor 18 for tuning is also shown. Receivers 42 and 43 are connected to the respective transmission and reception diplexers 44 and 45. The interior conductor 6, which has double capacitive shortening due to the additional capacitor 14, is particularly suitable for an extremely high resonant frequency.

In an further embodiment shown in FIG. 3, having a plurality of operating frequencies, a common interior conductor 8 is provided for the two resonant frequencies, and the common interior conductor 8 may contain a shortening capacitor 14, as well as additional shortening capacitors which are not shown in the drawing. At its beginning and end, the interior conductor 8 is provided with means for separately controlling the currents for both resonant frequencies $f_1$ and $f_2$. For this purpose, the beginning of the interior conductor 8 is connected to ground via trap circuits 54 and 56 and respective shortening capacitors 10 and 19. The opposite end is connected to ground via trap circuits 55 and 57 and shortening capacitors 21 and 22. The transmitter and receiver are respectively connected to terminals 46 and 47. The input lines respectively contain matching capacitors 32 and 33. The currents in the interior conductor 8 are set by the impedance of the trap circuits 54 and 56, and the trap circuits 55 and 57. The frequency of the other circuit is respectively blocked in the two trap circuits, for example the trap circuits 54 and 55 for the high frequency $f_1$. If, for example, the trap circuits 54 and 55 are in a blocking state, then only a current having the low-frequency $f_2$ flows in their current paths. Operation with both resonant frequencies is possible, ie., simultaneously operation with both the high resonant frequency $f_1$ and the low resonant frequency $f_2$, because currents having the high resonant frequencies $f_1$ can flow in the other current paths connected to the trap circuits 56 and 57 for the low-frequency $f_2$.

A common interior conductor 8 is also shown in the embodiment of FIG. 4, the conductor 8 with shortening capacitors 10, 14, 15, 19 and 20, although as in the other embodiments further capacitors not shown in the drawing may be used as well. The beginning of the conductor 8 is connected to ground via the shortening capacitor 10 and via a trap circuit 58. The beginning is also directly applied to ground via the shortening capacitor 19. In the same manner, the opposite end is connected to ground directly via the shortening capacitor 20, and via the shortening capacitor 15 in series with the trap circuit 59. In the embodiment of FIG. 4, the two shortening capacitors 19 and 20 are dimensioned for the high resonant frequency $f_1$. The two trap circuits 58 and 59 are also dimensioned for the high resonant frequency $f_1$. The two branches respectively containing the shortening capacitor 10 and the shortening capacitor 19 and the trap circuit 58, and the two branches respectively containing the shortening capacitors 15 and the shortening capacitor 20 and the trap circuit 59, each provide the effective shortening capacitance for the lower resonant frequency $f_2$. The respective capacitors 19 and 20 and the respective impedances of the trap circuits 58 and 59 are taken into consideration in dimensioning the respective capacitors 15 and 10 for the low frequency $f_2$. Two trap circuits are thus eliminated in this embodiment.

The trap circuits each contain a parallel resonant circuit, as shown in FIG. 5 wherein the trap circuit 50 is shown, in series with the shortening capacitor 10. Its inductance L and the capacitance C of the trap circuit 50 are dimensioned so that it has a high resonant circuit impedance Z at the resonant frequency which it should block. The maximum resonant circuit impedance Z is dependent on the losses at the resonant frequency, for example the resonant frequency $f_1 = 1/(2\pi\sqrt{LC})$. The resonant frequency $f_1$ or $f_2$ of a trap circuit is thus dimensioned for the resonant frequency of the neighboring branch that it is intended to block. The trap circuit 59, for example, blocks the higher resonant frequency $f_1$ in the circuit for the lower resonant frequency $f_2$.

As shown in FIG. 6, the trap circuits can be constructed as a line circuit, such as a coaxial conductor 70 shorted at one end. In the embodiment of FIG. 6, the coaxial conductor 70 has a jacket (not shown in detail) with a diameter of, for example, 10 mm and a length $\lambda_x/4$, wherein $\lambda_x$ is the line wavelength, which, for example, is about 30 cm for 170 Megahertz. It is also possible to use two parallel conductors to achieve the desired resonance, with the length and spacing of the parallel conductors being correspondingly selected.

As shown in FIG. 7, a capacitively shortened coaxial conductor 71 can be used to form a parallel resonant circuit in combination with a shortening capacitor 24 connected between the conductor 84 of the coaxial conductor 71 and ground. In this embodiment, a portion of the length $\lambda$ is compensated by the shortening capacitor 24. The jacket (not shown in the drawing) is again connected to ground. The shortening capacitor 24 has a capacitance $C_{24}$ given a predetermined resonant frequency $f_0$ of:

$$C_{24} = \frac{1}{2\pi f_o Z_1 \tan\beta};$$

wherein $Z_1$ is the line impedance, $\beta = 2\pi\lambda_v/\lambda_o$, and $\lambda_o$ is the line wavelength at the frequency $f_o$.

One embodiment for the interconnection of the interior conductors is shown in FIG. 8, with interior conductors 4 and 5 being provided with respective inputs 46 and 47 for the resonant frequencies $f_1$ and $f_2$. The interior conductors 4 and 5 are respectively connected to ground via shortening capacitors 19 and 20, which are dimensioned according to the high resonant frequency $f_1$. The two ends are each additionally connected to ground via respective series circuits consisting of the shortening capacitor 10 and a trap circuit 58 and the shortening capacitor 15 and a trap circuit 59. The shortening capacitors 10 and 19 in combination with the impedance of the trap circuit 58 form the shortening capacitance for the low resonant frequency $f_2$. In a similar manner, the shortening capacitors 15 and 20 and the impedance of the trap circuit 59 form the shortening capacitance for the low resonant frequency $f_2$. The beginning and end of the interior conductor 5 are connected in a similar manner to capacitances respectively formed by the shortening capacitors 11 and 22 and the impedance of a trap circuit 58a, and the combination of capacitors 21 and 23 and the impedance of a trap circuit 59a.

The beginning of the interior conductor 4 is connected to the input 46 via a trap circuit 60 for the resonant circuit $f_1$, a coaxial conductor 72, and a matching capacitor 34. The beginning of the interior conductor 4 is also connected to the input 47 via a trap circuit 61 for $f_2$, a coaxial conductor 75 and a matching capacitor 35. In the same manner, the beginning of the interior conductor 5 is connected to the input 46 via a coaxial conductor 73, a trap circuit 62 for $f_1$, and the matching capacitor 34. The start of the inner connector 5 is connected to the input 47 via a conductor 74, a trap circuit 63 for $f_1$ and the matching capacitor 35. A transmitter and a receiver for the low resonant frequency $f_2$ are connected to the input 46, preferably via a diplexer (not shown in FIG. 8) as in earlier embodiments. A transmitter and a receiver for the high resonant frequency fl are connected to the input 47 in the same manner. The matching capacitor 34 is dimensioned for the supplied, low resonant frequency $f_2$ of, for example, 69 MHz, and the matching capacitor 35 is dimensioned for the supplied, high resonant frequency $f_1$ of, for example, 170 MHz. Respective tuning capacitors 26 and 27 may be connected to the matching capacitors 34 and 35. The connecting lines between the capacitors 34 and 35 and the respective trap circuits 60 through 63 are each preferably formed by coaxial conductors provided with a shielding. The conductors 72, 73, 74 and 75 have respective lengths $\lambda_{72}$, $\lambda_{73}$, $\lambda_{74}$ and $\lambda_{75}$. The length differences $\lambda_{73}-\lambda_{72}$ and $\lambda_{75}-\lambda_{74}$ are each $\lambda/2$ for the respective resonant frequency. The coaxial conductors 73 and 75 are thus each $\lambda/2$ longer than the conductors 72 and 74. The current in the conductors 4 and 5 thus exhibits a phase shift of 180°. The overall electrical length of the respective coaxial conductors is preferably at least $\lambda/2$ or a multiple thereof. The impedance at the feed point of the respective conductors 4 and 5 is then transformed into the same value at the respective locations of the matching capacitors 34 and 35. The influences of the trap circuits 60 through 63 are taken into consideration in determining the physical length of the lines.

For producing the 180° phase shift of the currents, the feed can be alternatively undertaken at the beginning of the interior conductor 4 and at the end of the interior conductor 5, as shown in FIG. 9. In this embodiment, the low resonant frequency $f_2$ is supplied via the matching capacitor 34 and coaxial conductors 76 and 77 and the trap circuits 60 and 62. The high resonant frequency $f_1$ is supplied via the matching capacitor 35 and the coaxial conductors 78 and 79 and the trap circuits 60 and 63. The coaxial conductors 76 and 77 will thus have the same line length, as will the coaxial conductors 78 and 79.

A further embodiment for coupling the interior conductors 4 and 5 is shown in FIG. 10. In this embodiment, the beginning of the interior conductor 4 is connected to the input 46 for the low resonant frequency $f_2$ via a trap circuit 64 for the resonant circuit $f_1$ and via a matching capacitor 36. The beginning of the interior conductor 4 is also connected to the beginning of the interior conductor 5 via a line having an interruption S which is connected to the input 47 for the high-frequency $f_1$ via a trap circuit 65 for the low resonant frequency $f_2$ and a matching capacitor 37. Tuning capacitors 36a and 37a may be provided as well in this embodiment. The interruption S forms two conductors 80 and 81 whose respective lengths $\lambda_{80}$ and $\lambda_{81}$ are selected such that a $\lambda/2$ phase shift occurs for the low resonant frequency $f_2$. The lengths of the conductors 80 and 81 are therefore selected such that $$\lambda_{80}+\lambda_{81}=\lambda/2$$

derives for the low resonant frequency $f_2$ and $$\lambda_{80}-\lambda_{81}=\lambda/2$$

derives for the high resonant frequency $f_1$. A direct feed is thus obtained for supplying the low resonant frequency $f_2$ to the interior conductor 4 and a feed via a $\lambda_2/2$ phase shift line is obtained to the interior conductor 5. For the high resonant frequency $f_1$, by contrast, the conductors 4 and 5 are supplied via lines having a length difference of $\lambda_1/2$. It is thus again assured that the currents in the conductors 4 and 5 are phase-shifted by 180° at both frequencies. Whole multiples N of the half wavelength can also be selected for the sum or for the difference of the line lengths according to the above equations.

As shown in FIG. 10, the interior conductor 4 can be connected via a coaxial conductor 82 to the trap circuit 64. The length $\lambda_{82}$ of the coaxial conductor 82 is selected such that the stray capacitance to ground of the trap circuit 64 at the beginning of the interior conductor 4 is transformed so that it is not a load at the high resonant frequency $f_1$.

Transmission line resonators which respectively generate linearly polarized radio frequency fields B have been described in connection with the above exemplary embodiments. It will be understood by those skilled in the art, however, that transmission line resonators which generate circularly polarized radio frequency fields B can also be used. If this is done, two linearly polarizing transmission line resonators are arranged inside the sheath 2, with the respective conductor systems of those resonators being rotated by 90°.

In general, a transmission line resonator for a nuclear magnetic resonance tomography apparatus can be provided in accordance with the principles of the present invention for n resonant frequencies, in which n current paths will be arranged at at least one end, containing n—1 trap circuits for the resonant frequencies to be blocked.

Although further modifications and changes may be suggested by those skilled in the art, it is the intention of the inventor to embody within the patent warranted herein all changes and modifications as reasonably and properly come within the scope of his contribution to the art.

I claim:

1. A radio-frequency antenna for a nuclear magnetic resonance tomography apparatus, comprising:
   a radio frequency-tight and low frequency-transmissive cylindrical sheath having a longitudinal axis;
   electrically conductive means disposed inside said cylindrical sheath parallel to said longitudinal axis for defining a plurality of conductive paths, each conductive path having an inductance and forming, in combination with a capacitance between that conductive path and said cylindrical sheath, a transmission line resonator having a unique resonant frequency;
   each transmission line resonator having an input for its unique frequency, each of said respective inputs being decoupled from the other transmission line resonator inputs; and
   a trap circuit disposed in at least one of said conductive paths for blocking the resonant frequency of at least one other conductive path.

2. An antenna as claimed in claim 1, wherein said conductive means comprises a plurality of separate electrical conductors, with each electrical conductor forming one of said plurality of conductive paths.

3. An antenna as claimed in claim 1 wherein each of said conductive paths has a beginning and an end, and further comprising a plurality of trap circuits respectively disposed at each beginning and end of each conductive path.

4. An antenna as claimed in claim 1 wherein one of said conductive paths is for a highest resonant frequency, and further comprising an additional capacitance connected in said conductive path having the highest resonant frequency.

5. An antenna as claimed in claim 1 wherein said conductive means consists of a single conductor shared in common by said plurality of conductive paths.

6. An antenna as claimed in claim 5 wherein said single conductor includes a plurality of shortening capacitors.

7. An antenna as claimed in claim 5 wherein said single conductor has a beginning and an end each connected to ground via a first branch containing at least one shortening capacitor and via a second branch containing at least one shortening capacitor and at least one strap circuit for said highest resonant frequency.

8. An antenna as claimed in claim 1 wherein said trap circuit is a parallel resonant circuit having a resonant frequency which is the frequency to be blocked by said trap circuit.

9. An antenna as claimed in claim 1 wherein said trap circuit consists of a $\lambda/4$ coaxial conductor shorted at one end, wherein $\lambda$ is the line wavelength.

10. An antenna as claimed in claim 9 wherein said trap circuit contains a coaxial conductor shorted at one end and having a length $\lambda_b$ is less than $\lambda/4$, and having an input with a shortening capacitor connected between a conductor of said coaxial conductor and ground at said input.

11. An antenna as claimed in claim 1 wherein said conductive means includes first and second conductors forming respective ones of said conductive paths, wherein said transmission line inputs include a first input for a first frequency having a first wavelength and a second input for a second frequency at a second wavelength, and wherein said antenna further comprises:
- first, second, third and fourth trap circuits;
- first, second, third and fourth coaxial conductors;
- first and second matching capacitors respectively connected to said first and second inputs;
- said first conductor being connected to said first matching capacitor via said first trap circuit and said first coaxial conductor and to said second matching capacitor via said second trap circuit and said second coaxial conductor;
- said second conductor being connected to said first matching capacitor via said third trap circuit and said third coaxial conductor and to said second matching capacitor via said fourth trap circuit and said fourth coaxial conductor; and
- said first and third coaxial conductors differing in length by one-half of said first wavelength and said second and fourth coaxial conductors differing in length by one-half of said second wavelength.

12. An antenna as claimed in claim 1 wherein said conductive means includes first and second conductors, each having a beginning and an end, forming respective ones of said conductive paths, wherein said transmission line inputs include first and second inputs for respectively different frequencies, and wherein said antenna further comprises:
- first, second, third and fourth trap circuits;
- first, second, third and fourth coaxial conductors;
- first and second matching capacitors respectively connected to said first and second inputs;
- the beginning of said first conductor being connected to said first matching capacitor via said first trap circuit and said first coaxial conductor and to said second matching capacitor via said second trap circuit and said second coaxial conductor;
- the end of said second conductor being connected to said first matching capacitor via said third trap circuit and said third coaxial conductor and to said second matching capacitor via said fourth trap circuit and said fourth coaxial conductor; and
- said first and third trap circuits being identical and said second and fourth trap circuits being identical, and said first and third coaxial conductors being identical and said second and fourth coaxial conductors being identical.

13. An antenna as claimed in claim 1 wherein said conductive means includes first and second conductors forming respective ones of said conductive paths, wherein said transmission line inputs include a first input for a first frequency $f_1$ having a wavelength $\lambda_1$ and a second input for a second frequency $f_2$ at a wavelength $\lambda_2$, $f_2$ being grater than $f_1$, and said antenna further comprising:
- a first trap circuit for said first frequency;
- a second trap circuit for said second frequency;
- a coaxial conductor;
- a $\lambda_2/2$ line having an interruption splitting said $\lambda_2/2$ line into a longer part and a shorter part, said longer part being longer by $\lambda_1/2$ than said shorter part;
- first and second matching capacitors respectively connected to said first and second inputs;
- said first conductor being connected to said second matching capacitor via said coaxial conductor and said first trap circuit and to said first matching capacitor via said longer part of said $\lambda_2/2$ line and said second trap circuit; and
- said second conductor being connected to said first matching capacitor via said shorter part of said $\lambda_2/2$ line and said second trap circuit.

* * * * *